INVENTOR.
JOHN C. HUBBS
BY
[signature]
ATTORNEYS

Sept. 17, 1968 J. C. HUBBS 3,402,353

TRAPEZOIDAL PULSE GENERATOR WITH DIODE BRIDGE
FOR SWITCHING INDEPENDENT CURRENT SOURCES

Filed July 14, 1965 2 Sheets-Sheet 2

INVENTOR
JOHN C. HUBBS
BY
Fidelio and Swain
ATTORNEYS

United States Patent Office 3,402,353
Patented Sept. 17, 1968

3,402,353

TRAPEZOIDAL PULSE GENERATOR WITH DIODE BRIDGE FOR SWITCHING INDEPENDENT CURRENT SOURCES

John C. Hubbs, Lafayette, Calif., assignor to E-H Research Laboratories, Inc., Oakland, Calif., a corporation of California Filed July 14, 1965, Ser. No. 471,864
2 Claims. (Cl. 328—59)

ABSTRACT OF THE DISCLOSURE

A waveform generator for producing a trapezoidal pulse where the rise and fall ramps are provided by independent current sources which are selectively switched into a Miller integrator by a diode bridge. Additional diodes are coupled to the Miller integrator to clamp the output pulse at a predetermined amplitude.

The present invention relates generally to pulse generators.

Pulse generators when used in testing applications must meet very stringent performance requirements. In addition to the necessity of a relatively high pulse repetition rate, both the width of the pulse and its rise and fall characteristics must be precisely controlled. The magnitude of the output voltage may be of the order of 50 volts for some test requirements, and this voltage must be produced while maintaining the pulse width and the linearity of the rise and fall characteristics.

It is, therefore, an object of the invention to provide an improved pulse generator for generating pulses having precisely controlled rise and fall ramps and pulse width.

It is another object of the invention to provide a pulse generator which utilizes a Miller integrator to achieve pulse linearity.

It is yet another object of the invention to provide a pulse generator in which the rise and fall ramps of the output pulse may be independently varied.

It is still another object of the invention to provide a pulse generator which is substantially unaffected by the load impedance.

The foregoing and other objects of the invention will become more clearly apparent from the description when taken in conjunction with the accompanying drawings of which:

Figure 1:
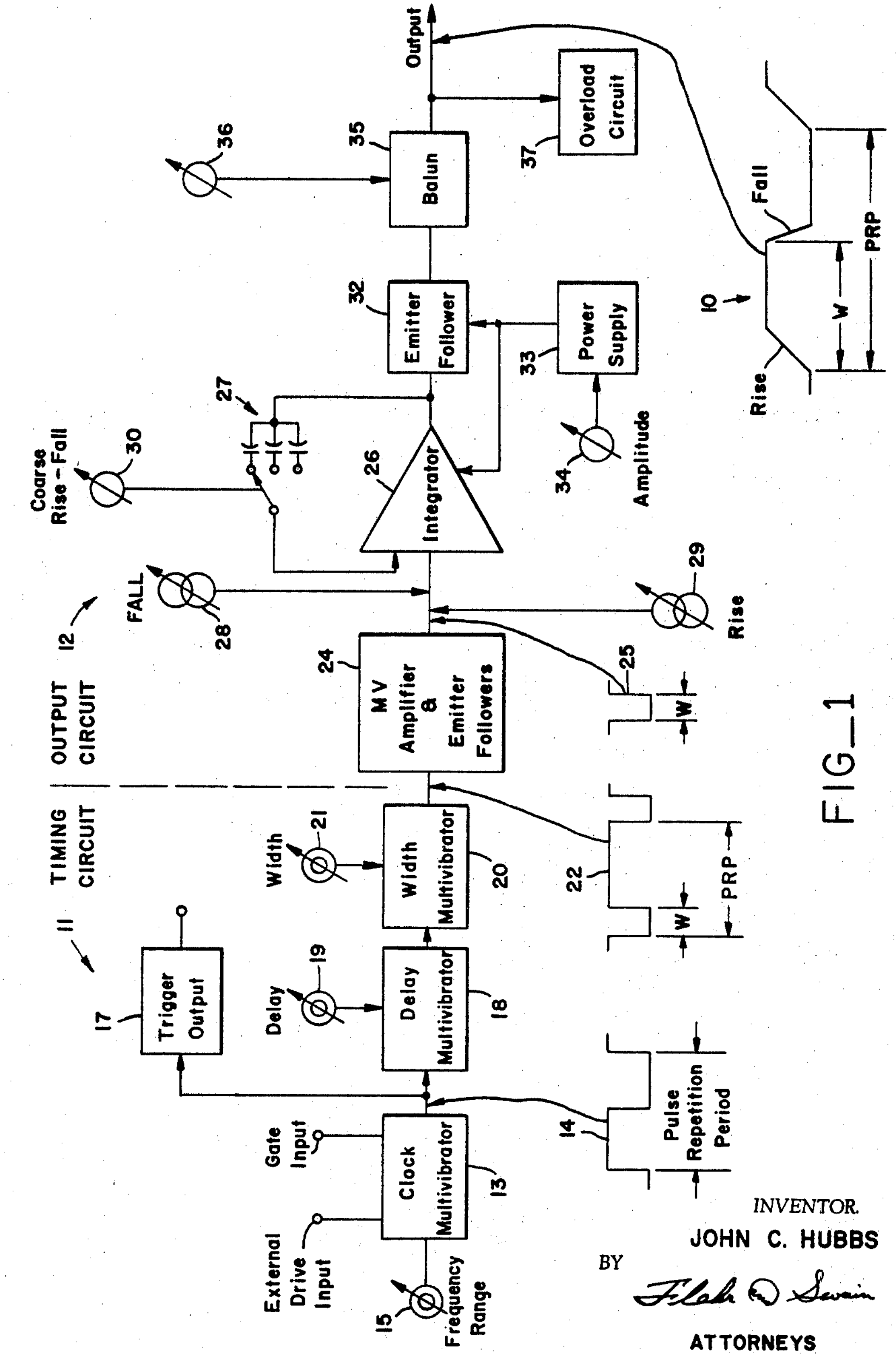
FIGURE 1 is a block diagram embodying the present invention.

The block diagram of FIGURE 1 along with its accompanying waveforms generally illustrates how the present invention produces an output pulse 10 having a predetermined pulse repetition rate or period (PRP), pulse width, W, rise and fall times, amplitude, and polarity. In addition, the pulse generator also performs a delay function where a specific time delay may be placed between a trigger pulse and the initiation of the output pulse.

The pulse generator is divided into two functional groupings; the first a timing circuit 11 which determines the pulse repetition rate, delay, and pulse width, and secondly, an output circuit 12 which controls the rise and fall time of the pulse, the amplitude, and the polarity.

Referring now specifically to the timing circuit 11, the pulse repetition rate is determined by a clock multivibrator 13, the pulse repetition period, as shown by waveshape 14, being selected by frequency range control 15.

The pulse repetition frequency may also be controlled by an external drive input as indicated, or a gate input. The output signal of multivibrator 13 is fed to both a trigger output circuit 17 and a delay multivibrator 18. Trigger output 17 provides an output pulse which serves as a time reference to, for example, trigger an oscilloscope, thus indicating the beginning of the pulse repetition period. Delay multivibrator 18 provides by means of delay control 19 any desired time delay between the trigger pulse and the desired start of the output pulse 10. The delay multivibrator is a monostable type multivibrator in which the delay period is selected by the adjustment of a resistance-capacitance network. A width multivibrator 20 having a width control 21 is coupled to delay multivibrator 18 and in response to an input from the delay device 18 produces an output pulse 22 having a predetermined pulse width, as indicated, and the same pulse repetition period as determined by clock multivibrator 13.

Thus in summary, the timing circuit 11 provides an output pulse 22 having a predetermined pulse repetition rate, width, and time delay from a reference time. Since such circuits are well known in the art, a detailed explanation of their construction will not be given.

The input stage of output circuit 12 is illustrated schematically by block 24 which includes a bistable multivibrator whose output is amplified by push-pull amplifiers which in turn drive emitter followers to produce an amplified and shaped pulse 25 still retaining the predetermined pulse width W.

Figure 2:
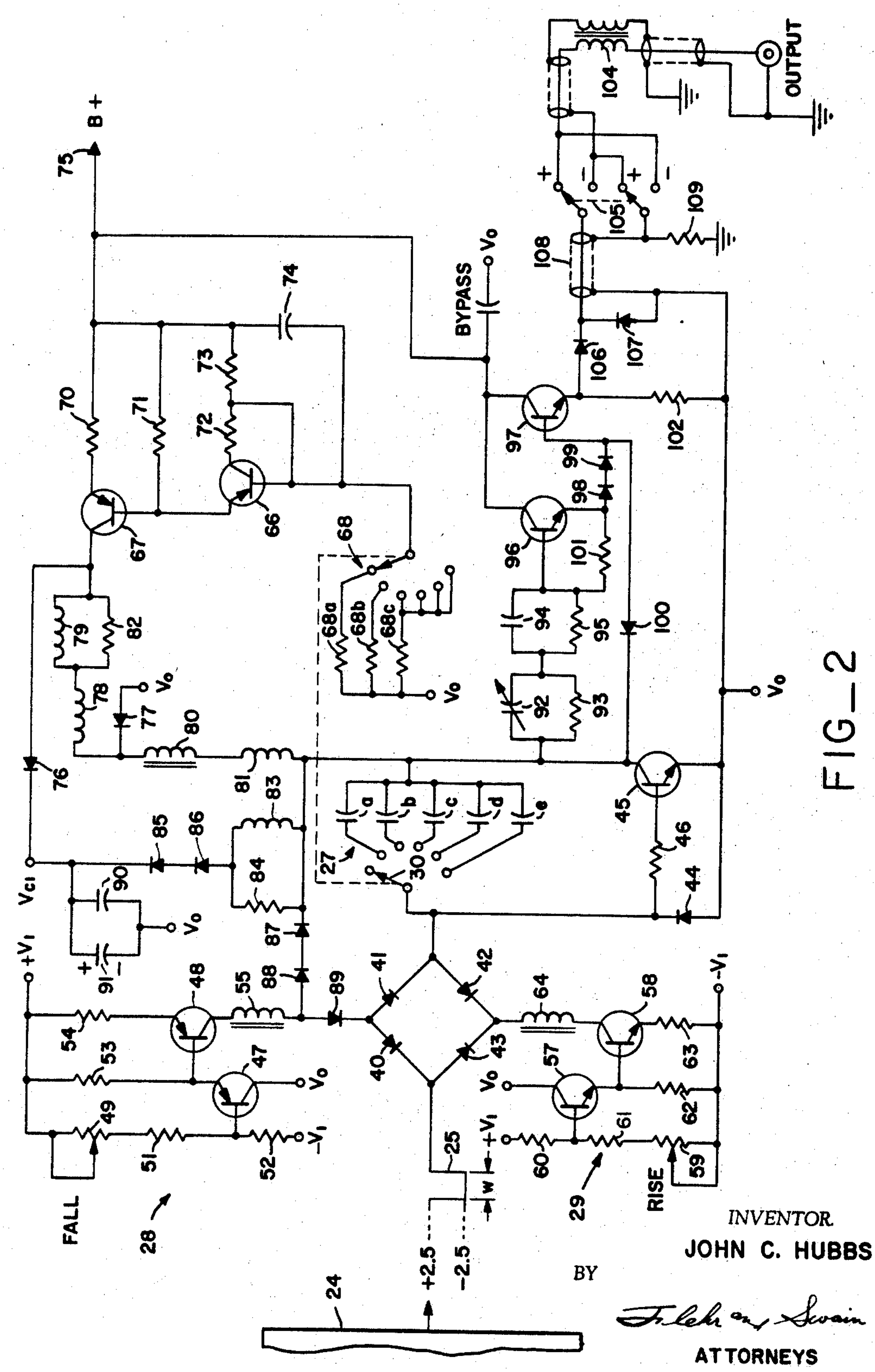
FIGURE 2 is a circuit schematic illustrating a portion of FIGURE 1.

In accordance with the invention, this pulse controls an integrator circuit 26 which may be of the Miller type, which provides the controllable and linear rise and fall ramps of output pulse 10. FIGURE 2 illustrates the integrator circuitry and accompanying circuits in greater detail, and thus the remainder of the output circuit will be discussed only from a functional point of view with regard to FIGURE 1.

Integrator 26 is basically well known in the art and is an integrating amplifier where a capactive integrating network 27 is connected between the output and input to provide a negative feedback. The inverse feedback through capacitance network 27 makes the amplifier attempt to keep its input voltage constant which requires a constant current into the input circuit. Under these conditions, the output voltage of the amplifier is substantially equal to the voltage across the capacitance network. Therefore, a constant current into the input of the amplifier which causes the integrating capacitance network to have a linear charging characteristic will produce an output voltage having a linear ramp. Moreover, the slope of the ramp is determined by the magnitude of the charging current. Accordingly, controllable constant current generators 28 and 29, indicated schematically, are provided which, as will be discussed in detail below, control the rise and fall ramps of the output pulse 10. Capacitance network 27 which is controlled by rise-fall control 30 provides a coarse control for the slopes of the rise and fall ramps while the respective current sources 28 and 29 determine the direction of the slopes, i.e., rise or fall, and furnishes vernier control.

The output of integrator 26 is coupled to an emitter-follower circuit 32 having a power supply 33 which is adjustable by control 34 to control the final amplitude of the output voltage 10. A balun 35 is coupled to emitter-follower 32 and direct couples the signal pulse to the output. In addition, the balun includes a polarity adjustment 36 to produce an output having either minus or a positive polarity, depending on the circuit requirements. Finally, an overload circuit 37 is responsive to excessively high outputs as, for example, may be caused by short circuits to prevent damage to the preceding parts of the circuit. Details of such an overload circuit will be found in copending application Ser. No. 334,855, filed Dec. 31, 1963, in the name of John C. Hubbs, entitled "Pulse Generator" and assigned to the present assignee and now Patent No. 3,309,540.

Referring now to FIGURE 2 which is a detailed schematic diagram of integrator 26 and its associated input and output circuits, the output pulse 25 from multivibrator-amplifier and emitter-follower 24 is fed to a diode bridge having diodes 40, 41, 42, and 43. The bridge 40–43 acts as a voltage driven current switch responsive to current from current generators 28 and 29 to switch independent constant currents of opposite polarity into and out of the base of a transistor 45. Transistor 45, in conjunction with the capacitive integrating network 27 and series connected resistor 46, forms an integrator amplifier. A clamping diode 44 is referenced to $V_0$ and connected to the intersection of diodes 41 and 42.

Variable constant current generator 28 comprises a two-stage transistor amplifier 47 and 48, a potentiometer 49 controlling base bias and fall time, and associated biasing and load resistors 51, 52, 53, and 54. In addition, supply voltages, $V_0$, $-V_1$, and $+V_1$ are also provided. A series choke 55 filters the output from the collector of transistor 48 to increase the band pass of the current source.

Similarly, variable constant current source 29 includes a two-stage transistor amplifier 57 and 58 which is supplied by voltages $V_0$, $+V_1$, and $-V_1$, a potentiometer 59 controlling base bias and rise time and associated biasing and load resistors 60, 61, 62, and 63. A series choke inductance 64 performs the same function in increasing band pass as choke 55 in fall circuit 28.

Collector current for transistor 45 is held constant for any given pulse condition by a two stage amplifier comprising transistors 66 and 67 which are biased and loaded by associated resistors 70, 71, 72, 73, and a capacitor 74. A resistive switching network 68 is coupled to the base of transistor 66 and the switch itself is ganged to the coarse rise-fall switch 30. Thus, the current output of the amplifier may be controlled as a function of the coarse ramp rate. Current output is also a function of pulse amplitude which is controlled by power supply 33 (see FIGURE 1). B+ lead 75 of amplifier 66, 67 is coupled to this power supply and any change in pulse amplitude therefore affects the B+ voltage to in turn vary the current output of the amplifier. Thus, the collector current into transistor 45 is decreased with decreased amplitude. A bypass capacitor is coupled between B+ and $V_0$ to handle large peak current drains.

Diodes 76 and 77 are coupled to the collector of transistor 67 and serve as clamp diodes to limit the excursions of the collector between the amplitude clamp voltage, $V_{cl}$, which is the B+ voltage minus a predetermined voltage (e.g., 10 volts), and $V_0$ to which clamp 77 is coupled. Also provided in the collector current source to transistor 45 are series chokes 78, 79, 80, and 81 which again perform the function of increasing the band pass of the sources. Resistor 82 which is in parallel with choke 79 damps the self-resonant ring of the large iron core choke.

Parallel connected inductance 83 and resistor 84 which are connected between the collector of transistor 45 and series diodes 85 and 86 provide a preemphasis circuit to shape the top corner of the leading edge or rise ramp of the output pulse to compensate for the frequency characteristics of balum 35 (FIGURE 1). Diodes 85 and 86 clamp the collector output voltage of transistor 45 at $V_{cl}$. Diodes 87 and 88 are coupled to the bridge 40–43 through another diode 89 and provide a clamp voltage for the bridge circuit. The clamp voltage, $V_{cl}$, is coupled to the cathodes of diodes 76 and 85 by means of the $V_{cl}$ input terminal. Parallel connected capacitors 90 and 91 are also coupled to the $V_{cl}$ terminal and terminated at $V_0$.

The output pulse from the collector of transistor 45 is coupled to a high frequency preemphasis network which is composed of parallel connected variable capacitor 92 and resistor 93 series connected with another parallel combination of a capacitor 94 and a resistor 95 which are in turn coupled to the base of a transistor 96. The output pulse from transistor 45 is both modified and phase-shifted by the preemphasis network and the two-stage output amplifier 96, 97. These are cascaded emitter-follower amplifiers which are illustrated in FIGURE 1 as block 32, and are supplied by means of terminal 75 from power supply 33. Capacitor 92 is adjusted for the best ramp leading edge waveform.

The emitter of transistor 96 is direct coupled to the base of output transistor 97 through series diodes 98 and 99. The voltage drop across these diodes ensures that the output transistor 97 will be in an off condition during the quiescent period of the pulse generator. The diodes 98 and 99 are reverse biased on the pulse trailing edge or fall ramp so that transistor 96 is ineffective at this time. However, during this time, output transistor 97 is directly coupled to the collector of transistor 45 through a forward biased diode 100.

Biasing and load resistors 101 and 102 are also provided for emitter-followers 96 and 97.

Coupled to the emitter of output transistor 97 is a pulse inverting balun 104. When the polarity switch 105 is connected as indicated, a positive pulse will be produced and similarly in its negative switching state the pulse will be inverted. Diode 106 couples the output pulse to balun inverter 104 which at this point at the output of transistor 97 is always positive. Diode 107 couples the output circuits to the reference voltage voltage of $V_0$. The output cable shield 108 is connected to ground through resistor 109.

OPERATION

The input pulse 25 from multivibrator-amplifier and emitter-followers 24 contains information as to the final pulse width, delay, and pulse repetition frequency. It is a function of the remainder of the circuit to impart to it a proper amplitude, polarity, and most important, to shape the leading and trailing edges of the pulse to predetermined rise and fall ramps of selected slopes which are linear. In accordance with the invention, the diode bridge 40–43 acts as a double pole double throw switch to direct current into and out of integrator 45.

In the quiescent state, the potential at the input bridge is positive. For ease of explanation, the nominal potential of +2.5 volts is given, and for the negative swing of the input pulse a −2.5 volts. In explaining how this input voltage forward and back biases the various diodes of the bridge, nominal operating voltages will also be mentioned at these points. Since the potential at the input of the bridge which is the junction of diodes 40 and 43 is +2.5 volts, diode 43 is forward biased, and diode 40 reversed biased. With the forward bias of diode 43, the voltage at its cathode and the intersection of 42 and 43 is approximately +2 volts, and with the potential at the junction of diodes 41 and 42 at approximately a +1.5 volts, the diode 42 is therefore back biased. However, diode 41 is forward biased since the voltage at its anode is approximately +2 volts as determined by current generator 28. In this condition, current is conducted into the base of transistor 45 from the fall current generator 28 through diode 41 to hold the transistor on.

Upon the initiation of a pulse from the timing circuit, the input to the bridge circuit drops to a −2.5 volts causing diode 40 to now conduct. This conduction produces a potential at its anode of approximately −2 volts to reverse bias diode 41. The junction of diodes 41 and 42 begins to move negatively from its former value of +1.5 volts. However, the negative movement is clamped to approximately −1 volt by diode 44 which is referenced to $V_0$. Diode 42 is now forward biased, and its cathode voltage is approximately a minus two volts. Diode 43 is also reversed biased. In this condition, current from the base of transistor 45 flows through diode 42 to the rise constant current generator 29.

In accordance with the invention, the over-all integrator comprising transistor 45, resistor 46, and capacitor 27, does not allow the voltage at the junction of 41, 42 to move in a step from its positive to minus value on the initiation of a pulse but rather as a ramp starting at +1.5 volts and moving gradually, relatively speaking, toward a −1 volt where it is clamped by diode 44. When a negative voltage step is delivered to the integrator input which is the base of transistor 45, the collector voltage starts to rise at a constant rate determined by the feedback capacitor and the negative current from rise constant current source 29. The collector voltage continues to rise until it reaches the amplitude clamp voltage $V_{cl}$. Clamp diodes 85 and 86 conduct to terminate the ramp at $V_{cl}$. Thus, the rise ramp of the output pulse 10 is provided by the integrator circuit and is variable by adjusting in combination the coarse rise-fall control 27 which switches in various values of capacitance and, in addition, the vernier or fine rise control 59 of rise current source 29 to control the negative current from the transistor 45.

At the end of the pulse 25 the diode bridge input is again switched back to +2.5 volts, and positive current from fall constant current generator 28 flows into the base of transistor 45 through diode 41. The ramp integrating capacitor 27 is discharged at a linear rate until the collector voltage of transistor 45 finally rests in its quiescent condition. Again, this fall function of the pulse is determined by the specific integrating capacitor 27 which is switched into the circuit and the adjustment of potentiometer 49 of constant current source 28.

When the collector of transistor 45 finally drops to its quiescent value, clamp diodes 87 and 88 conduct to divert some of the positive current that flows from source 28 to the base of transistor 45 into the collector of the transistor and thus establish equilibrium. The pulse base line is established with the collector voltage resting at the clamp voltage of diode 87.

The width W of the input pulse 25 is, of course, reflected in the output pulse of transistor 45. The pulse is coupled into the emitter-follower cascade amplifiers 96, 97 through network 92–95 as discussed above. Transistor 96 drives transistor 97 for the pulse leading edge, and during the fall of the pulse, diode 100 conducts enabling the transistor 97 to follow the collector of transistor 45 down to its quiescent value.

By use of the preemphasis network 92–95 two objects are accomplished. First, the slight phase shift introduced by the network optimizes the leading edge or rise ramp of the output pulse. Secondly, the preemphasis network serves as a buffer to the output in conjunction with emitter-followers 96, 97 thus isolating the integrator against any variation in the type of output load impedance such as inductive or capacitive components.

Finally, the output of transistor 96 is coupled to the final output terminal through the inverter-balun 104 to produce a positive or negative output pulse as illustrated by waveshape 10 of FIGURE 1.

The invention has been constructed and the following table gives the type designations of the components, values, operating voltages, and the output characteristics of the circuit:

*Voltages*

| | |
|---|---|
| $-V_1$ | −10 |
| $+V_1$ | +10 |
| B+ | 10–50 |
| $V_{clamp}$ | B+, −10 |
| $V_0$ | [1] Common |

[1] Voltages are referenced to $V_0$.

*Diodes*

| | |
|---|---|
| **40–44, 100, 86** | 1D6–050 |
| **87, 77** | 1N270 |
| **76, 85, 88, 89, 98, 99, 106, 107** | 1N91413 |

*Transistors*

| | |
|---|---|
| **58** | 2N950 |
| **57** | CDQ10239 |
| **48** | 2N1692 |
| **47, 66** | 2N1132 |
| **45, 96** | 2N2950 |
| **67** | DTG2400 |
| **97** | 2N2876 |

*Capacitors*

| | | |
|---|---|---|
| **91** | μf | 10 |
| **90** | μf | .01 |
| **92** | pf | 8–50 |
| **94** | pf | 20 |
| **27*a*** | pf | 33 |
| **27*b*** | pf | 150 |
| **27*c*** | pf | 500 |
| **27*d*** | μf | .0015 |
| **27*e*** | μf | .005 |
| **74** | μf | 10 |

*Inductors*

| | | |
|---|---|---|
| **55, 64** (ferrite core choke) | microhenry | 100 |
| **80** (ferrite core choke) | do | 10 |
| **78** (ferrite core choke) | millihenry | 1 |
| **83** (air core choke) | microhenry | .68 |
| **81** (air core choke) | do | 1.5 |
| **79** (iron core choke) | millihenry | 30 |

*Resistors*

| | ohms | | ohms |
|---|---|---|---|
| **46** | 24 | **70** | 20 |
| **51** | 680 | **71** | 510 |
| **52** | 4.7K | **72** | 2.7K |
| **53** | 510 | **73** | 620 |
| **54** | 30 | **82** | 1.8K |
| **60** | 2.4K | **84** | 20 |
| **61** | 270 | **93** | 100 |
| **62** | 510 | **95** | 51 |
| **63** | 50 | **101** | 100 |
| **68*a*** | 8.2K | **102** | 1K |
| **68*b*** | 18K | **109** | 500 |
| **68*c*** | 10K | | |

*Operating characteristics*

| | |
|---|---|
| Pulse repetition frequency | 1 kilocycle to 5 megacycles internal, zero to 5 megacycles external. |
| Output pulse amplitude | Positive or negative 20 to 50 volts into 50 ohms, variable. |
| Rise time | 10 nanoseconds to 10 microseconds continuously variable. Linearity better than 2 percent from 20 nanoseconds to 10 microseconds. |
| Fall time | 20 nanoseconds to 10 microseconds. Coarse selector provides 1/3/10 sequence control with independent fine controls for rise and fall covering a 3:1 range. |
| Pulse width | 50 nanoseconds to 300 microseconds. |
| Pulse delay | 50 nanoseconds to 100 microseconds. |

Thus, the present invention provides an improved pulse generator for producing a pulse having precision independently controlled rise and fall ramps. In addition, such ramps are controllable throughout a large range, all the while maintaining adequate linearity. Immunity to variations in the types of output loads is also provided.

I claim:

1. A pulse generator comprising: diode bridge means having an input and an output terminal with variable constant current sources of opposite polarity coupled thereto; an integrator amplifier coupled to said output terminal and selectively responsive to said opposite polarity currents to produce an output pulse having a rise and fall characteristic whose slopes are determined by the polarity and magnitude of said respective opposite polarity currents; and means coupled to said input terminal of said bridge for controlling said bridge means to selectively couple said opposite polarity current sources to said integrator amplifier.

2. A pulse generator comprising: diode bridge means having an input and an output terminal; variable constant current sources of opposite polarity coupled to said bridge means; an integrating amplifier having a negative feedback capacitor connected between the output and input of such amplifier, such input being connected to said output terminal of said bridge means, said amplifier being selectively responsive to said opposite polarity currents to produce an output pulse having a rise and fall characteristic whose slopes are determined by the polarity and magnitude of said respective opposite polarity currents; and means coupled to said input terminal of said bridge for controlling said bridge means to selectively couple said opposite polarity currents sources to said amplifier.

References Cited

UNITED STATES PATENTS

| | | | |
|---|---|---|---|
| 3,007,055 | 10/1961 | Herzfeld | 307—88.5 |
| 3,125,694 | 3/1964 | Palthe | 307—88.5 |
| 3,283,259 | 11/1966 | Banks | 307—88.5 X |
| 3,312,837 | 4/1967 | Flynn et al. | 307—88.5 |

ARTHUR GAUSS, *Primary Examiner.*

S. D. MILLER, Jr., *Assistant Examiner.*